(12) United States Patent
Zeng et al.

(10) Patent No.: US 8,290,095 B2
(45) Date of Patent: Oct. 16, 2012

(54) VITERBI PACK INSTRUCTION

(75) Inventors: Mao Zeng, Austin, TX (US); Lucian Codrescu, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 984 days.

(21) Appl. No.: 11/389,443

(22) Filed: Mar. 23, 2006

(65) Prior Publication Data

US 2007/0223629 A1  Sep. 27, 2007

(51) Int. Cl.
H04L 27/06 (2006.01)
(52) U.S. Cl. ........ 375/341; 375/262; 375/265; 704/242; 714/792; 714/795
(58) Field of Classification Search .................. 375/341; 712/221, 224
See application file for complete search history.

(56) References Cited

U.S. PATENT DOCUMENTS

| 4,012,722 | A | * | 3/1977 | Gajski et al. .................. 712/224 |
| 5,951,624 | A | | 9/1999 | Gray et al. |
| 6,115,808 | A | * | 9/2000 | Arora ............................. 712/219 |
| 6,654,878 | B1 | | 11/2003 | Swanberg et al. |
| 7,315,531 | B2 | | 1/2008 | Black et al. |
| 2004/0136336 | A1 | | 7/2004 | Nakamura et al. |
| 2004/0139288 | A1 | * | 7/2004 | Perego et al. .................. 711/154 |
| 2004/0193995 | A1 | | 9/2004 | Park et al. |
| 2005/0149701 | A1 | * | 7/2005 | Chen et al. .................... 712/221 |

FOREIGN PATENT DOCUMENTS

| JP | 2002521907 A | 7/2002 |
| KR | 20030066631 | 8/2003 |
| WO | WO0005819 A1 | 2/2000 |
| WO | WO2005006183 A2 | 1/2005 |

OTHER PUBLICATIONS

I. Bogdan, M. Munteanu, P.A. Ivey, N.L. Seed, N. Powell: Power Reduction Techniques for Viterbi Decoder Implementation: Internet Article [online] 2000, XP002453565, Electronic Systems Group, University of Sheffield, Mappin Street, Sheffield SI 3EA, UK.
Maitang Mark: "Bit Programming" Internet Article, [online], Apr. 17, 2005, XP002453566.
International Search Report and Written Opinion—PCT/US2007/064816, ISA/EPO—Dec. 11, 2007.
P.K.Singh, et al., "A Low-complexity, reduced-power Viterbi Algorithm," 12'th International Conference on VLSI Design, Jan. 7-10, 1999.
International Conference on VLSI Design, Jan. 7-10, 1999.

* cited by examiner

*Primary Examiner* — David C. Payne
*Assistant Examiner* — Adolf Dsouza
(74) *Attorney, Agent, or Firm* — Peter Michael Kamarchik; Nicholas J. Pauley; Jonathan T. Velasco

(57) ABSTRACT

A Viterbi pack instruction is disclosed that masks the contents of a first predicate register with a first masking value and masks the contents of a second predicate register with a second masking value. The resulting masked data is written to a destination register. The Viterbi pack instruction may be implemented in hardware, firmware, software, or any combination thereof.

26 Claims, 4 Drawing Sheets

VITERBI PACK INSTRUCTION

BACKGROUND

I. Field

The present disclosure generally relates to a Viterbi pack instruction. More particularly, the disclosure relates to a Viterbi pack instruction for packing bits from multiple predicate registers into a single destination register.

II. Description of Related Art

A Viterbi algorithm is an algorithm useful in communications. It may be used to decode convolutional codes used in wireless communications systems. Such codes are used in many forms of wireless communications, such as, for example only, code division multiple access (CDMA), CDMA2000, wideband code division multiple access (WCDMA), time division synchronous code division multiple access (TD-SCDMA), and global system for mobile communications (GSM). A Viterbi algorithm may also be used as an error-correction scheme, in 802.11 wireless local access networks (WLANs), in speech recognition and for many other purposes.

With a Viterbi algorithm, one finds the most likely sequence of hidden states (sometimes called the Viterbi path), in a trellis of states where there are multiple states with multiple paths that lead to each state. To determine which transition between states is most likely (sometimes called a survivor path), one may compare the likelihood of different transitions. A survivor path can be determined for each relevant state transition period across the trellis. In a Viterbi decoder, e.g., a traceback is later performed along the survivor paths to generate the output bits.

When executing a Viterbi algorithm it is common to generate and compare path metrics representing the likelihood of different transitions. A flag bit can represent the output of such a comparison. This output may be stored in memory, e.g., to be used later when performing the traceback. Having the results of several compares written into memory from separate registers takes up more memory.

For example, in a 3G wireless communications system, such as WCDMA and CDMA2000, if each flag representing the output of a comparison of two path metrics were stored in a separate byte of memory, it would take 268×256 bytes=68 kbytes of memory. However, if these bits could be stored as bits and not as bytes, it would only take 268×256/8=8 kbytes of memory.

Speed is affected by more save operations being required. This may lead to more possible cache misses. Additionally, if the flags are not saved in a natural order, it can take more cycles to perform a traceback.

Because the Viterbi algorithm is critical to, for instance, decoding the convolutional codes used in many wireless communications systems, the speed of execution of the algorithm directly affects the performance of, for example, a wireless communications system.

Accordingly, it would be advantageous to provide a Viterbi pack instruction that packs the bits within two or more predicate registers into a single destination register to speed up processing time and save memory space.

SUMMARY

A Viterbi pack instruction is disclosed and includes packing selected bits of one predicate register and selected bits of another predicate register into a single destination register.

In a particular embodiment, the Viterbi pack instruction masks the contents of a first predicate register with a first masking value and masks the contents of a second predicate register with a second masking value. The resulting masked data is written to a destination register. In another particular embodiment, the first masking value is a hexadecimal 55 and the second masking value is a hexadecimal AA. In a further particular embodiment the resulting masked data is ORed together prior to writing it to the destination register.

In another particular embodiment, the Viterbi pack instruction comprises a Viterbi pack circuit. The Viterbi pack circuit comprises a first and second predicate register, a destination register, memory, a first and second AND gate and an OR gate.

In still another particular embodiment, a digital signal processor is disclosed that operates the Viterbi pack instruction. In another particular embodiment, a wireless communications device is disclosed that comprises the Viterbi pack instruction.

An advantage of one or more of the embodiments disclosed herein can include reducing the time to execute a Viterbi algorithm.

An advantage of one or more of the embodiments disclosed herein can include saving memory space.

Another advantage can include quicker acquisition time for a wireless communications device, such as a cellular phone, in a wireless communications system.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

The aspects and the attendant advantages of the embodiments described herein will become more readily apparent by reference to the following detailed description when taken in conjunction with the accompanying drawings wherein.

DETAILED DESCRIPTION

Figure 1:
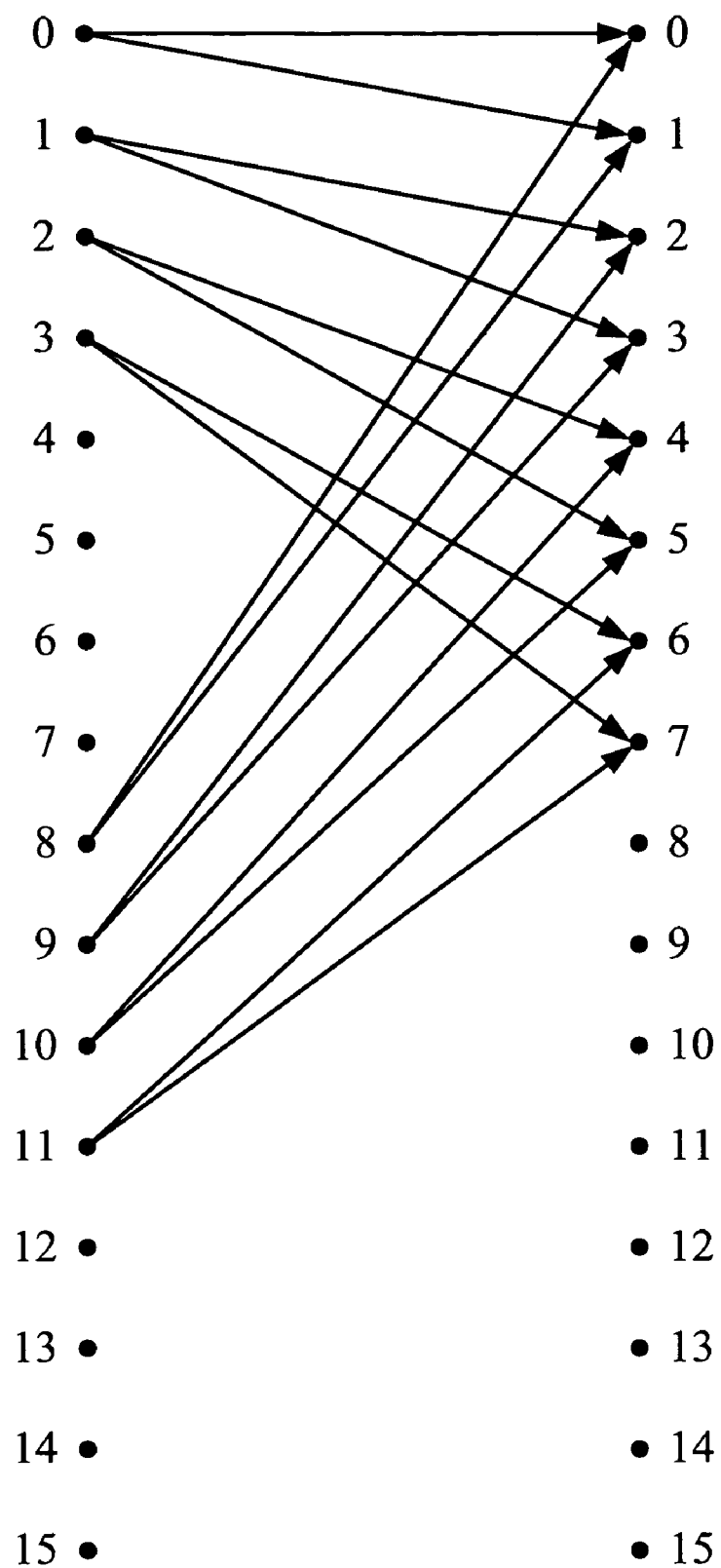
FIG. 1 is an exemplary state diagram such as those associated with a Viterbi algorithm.

FIG. 1 illustrates an example of a trellis of states such as those associated with a Viterbi algorithm. In this example, 16 possible states (0-15) are shown. As shown, each state on the right hand side 0-7 can be reached from two different states on the left side. For example, state 0 can be reached from either state 0 or state 8.

Figure 2:
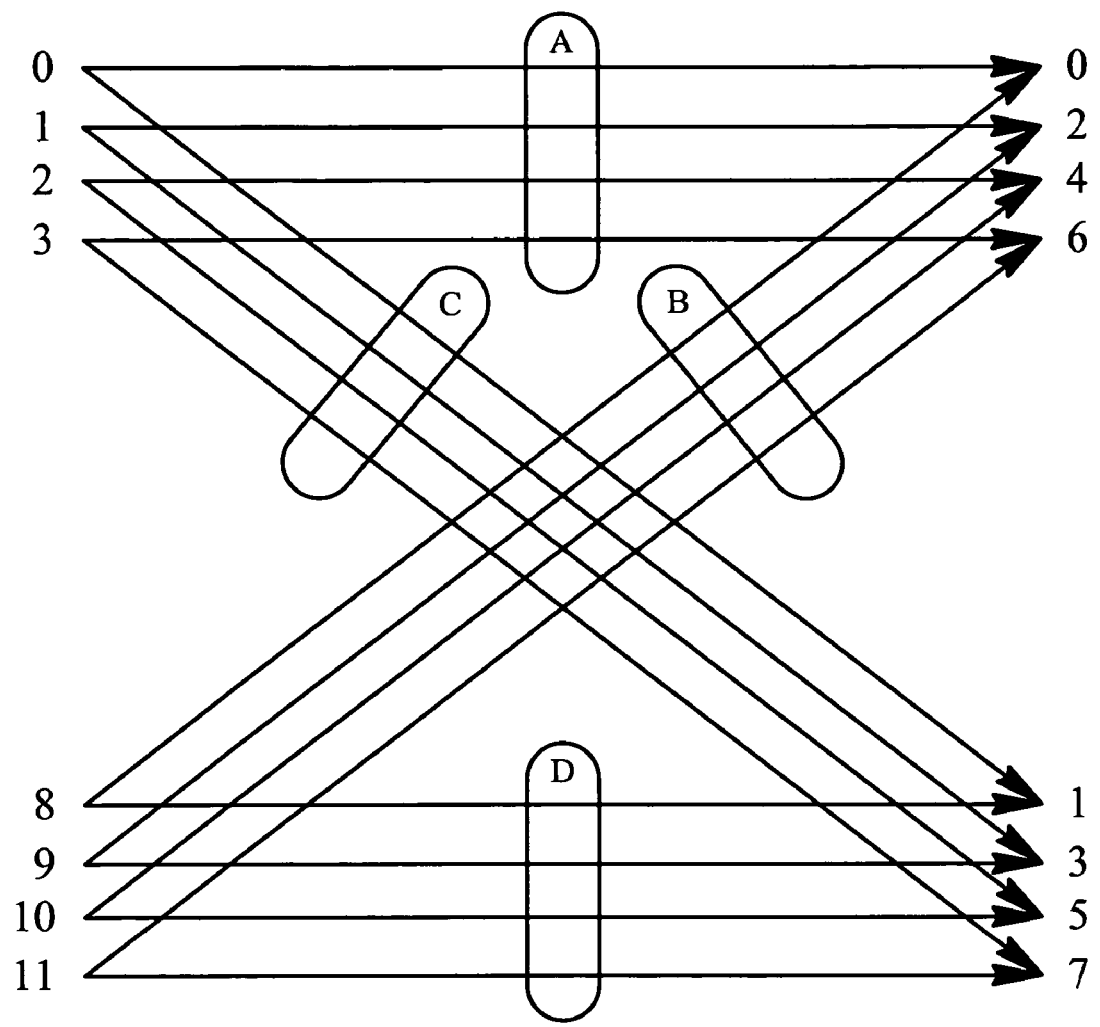
FIG. 2 is a vector diagram based on the state diagram of FIG. 1.

FIG. 2 illustrates a vector diagram depicting the possible transitions between states shown in FIG. 1. In this example, four vectors are shown, A-D. Vector A represents the transitions from states 0, 1, 2 and 3 to states 0, 2, 4 and 6. Vector B represents the transitions from states 8, 9, 10 and 11 to states 0, 2, 4, and 6. Vector C represents the transitions from states 0, 1, 2 and 3 to states 1, 3, 5 and 7. Vector D represents the transitions from states 8, 9, 10 and 11 to states 1, 3, 5 and 7.

As mentioned earlier, in a Viterbi algorithm, the most likely path is determined. To determine which path is most likely, a vector comparison may be used that compares the likelihood of different transition vectors.

It may be desirable to have a compare instruction that can compare contents of registers. A versatile compare instruction may be one that is capable of performing byte compares, 16-bit half-word compares, word compares and long word compares so that the algorithm could be used in various situations. With such a compare instruction, the comparison of a long word with another, may, for example, generate an output of a single bit that indicates which long word is greater. A comparison of two words with two other words may generate an output of two bits, each bit representing the result of one of the word comparisons. Similarly, four half-word compares may generate four bits and eight byte compares may generate eight bits. To simplify storage of the results, each of the compare results may be written into a byte of data in a destination register, with a long word compare the resulting bit may be written into all bits of a byte within the destination register rather than just one bit. For a word comparison, the first resulting bit could be written into the first four bits of the byte and the second resulting bit could be written into the other four bits. For a half-word compare, the first resulting bit can be written into the first two bits, the second could be written into the next two bits and so on.

Figure 3:
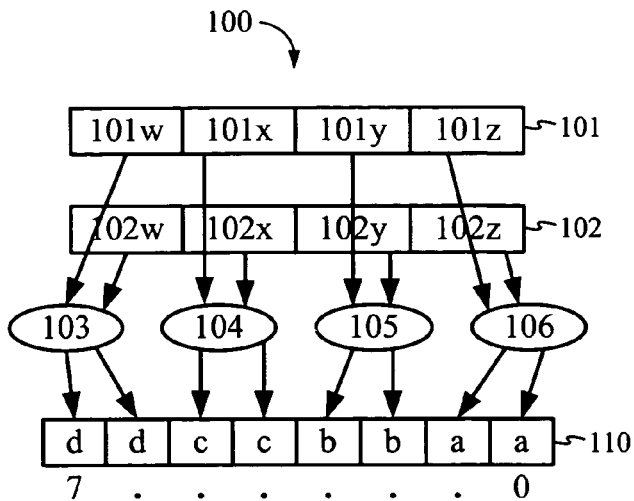
FIG. 3 is a functional diagram depicting a vector compare instruction.

FIG. 3 illustrates the functioning of a versatile vector compare instruction 100 that may be useful with a Viterbi algorithm, such as during a Viterbi decoding.

In a vector compare instruction 100 for use in Viterbi decoding, for example, the A vector stored in register 101 is compared with the B vector stored in register 102 and the results are stored in predicate register 110. The vectors and registers may be of any appropriate size. For example, the both the A vector and the B vector may consist of four 16-bit half-words, $101w$-$101z$ and $102w$-$102z$, each half-word representing path metrics of one of the state transitions shown in FIGS. 1 and 2, e.g., state 0 to state 0. The A vector may be stored in a 64 bit register 101 and the B vector may be stored in a 64 bit register 102. Register 101 and register 102 may alternatively be implemented as a plurality of registers. For instance, one or both may be comprised of two separate registers.

Compares 103-106 each compare a respective half-word $101w$-$101z$ with a respective half-word $102w$-$102z$, as shown. As discussed above, a versatile vector compare instruction may simply store the resulting bit for each compare 103-106 in two adjacent bits in predicate register 110. Thus, the result of compare 103, bit d, may be written into both bits 7 and 6 of predicate register 110. Similarly, bits c, b and a each may be written into two bits of predicate register 110.

Figure 4:
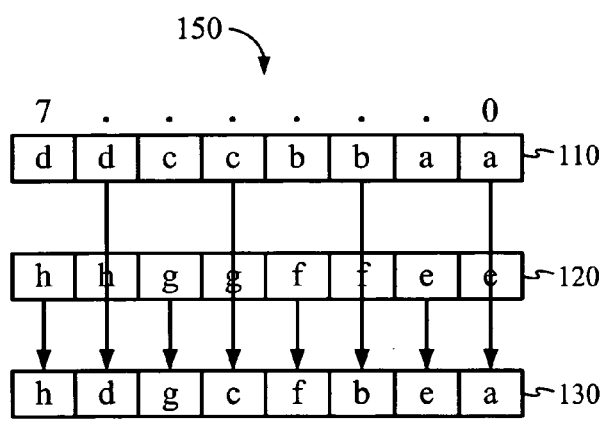
FIG. 4 is a functional diagram depicting a Viterbi pack instruction.

FIG. 4 illustrates the functioning of an exemplary Viterbi pack instruction 150. In this non-limiting example, predicate register 110 contains the results of a vector compare instruction 100 and predicate register 120 contains the results of a vector compare instruction that may have compared other vectors, C and D, for example. Rather than leave the results of the two vector compare instructions in two registers, in Viterbi pack instruction 150 those results are packed into destination register 130. Destination register 130 may be of any adequate size, for example, 8 bits long or larger. Viterbi pack instruction 150 can be implemented through software, firmware, hardware or any combination thereof.

In a non-limiting embodiment, Viterbi pack instruction 150 can be represented as follows:

$$R_D = (P_0 \& 0x55) | (P_1 \& 0xAA)$$

where $R_D$ is destination register 130, $P_0$ is first predicate register 110 and $P_1$ is second predicate register 120.

During the execution of this non-limiting embodiment of Viterbi pack instruction 150, the even bits of predicate register 110 (d, c, b and a) are written into the even bits of destination register 130 (bits 6, 4, 2 and 0). Additionally, the odd bits of predicate register 120 (h, g, f and e) are written into the odd bits of destination register 130 (bits 7, 5, 3 and 1). Thus, the bits in destination register 130 will alternate between the bits stored in the two predicate registers 110 and 120. In this fashion, the bits in destination register 130 are placed in a more natural order so as to speed up processing.

It should be noted that for vector compares that compare long words or words, eight or four predicate registers could be packed into a single byte in a destination register by alternating the bits from each register.

Figure 5:
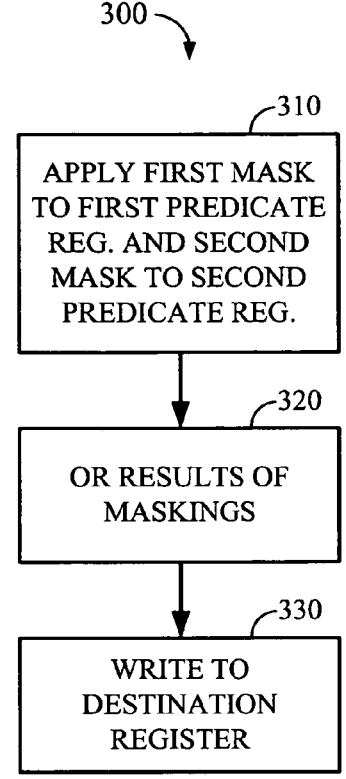
FIG. 5 is a flow chart depicting a method of a Viterbi pack instruction.

FIG. 5 illustrates a Viterbi pack method. According to a non-limiting embodiment of the method 300, a first masking value may be applied to the contents of the first predicate register 110 and a second masking value may be applied to the contents of the second predicate register 120 in step 310. For example, the first masking value may be a hexadecimal 55 and the second masking value may be a hexadecimal AA. For packing more than two registers, such as where long word or word compares are performed, other different hexadecimal masking values would be used.

In step 320, the masked data resulting from the two maskings are ORed together. Then in step 330, the ORed data is written to destination register 130. These steps may occur on a bitwise basis with steps occurring concurrently for different bits if desired.

Figure 6:
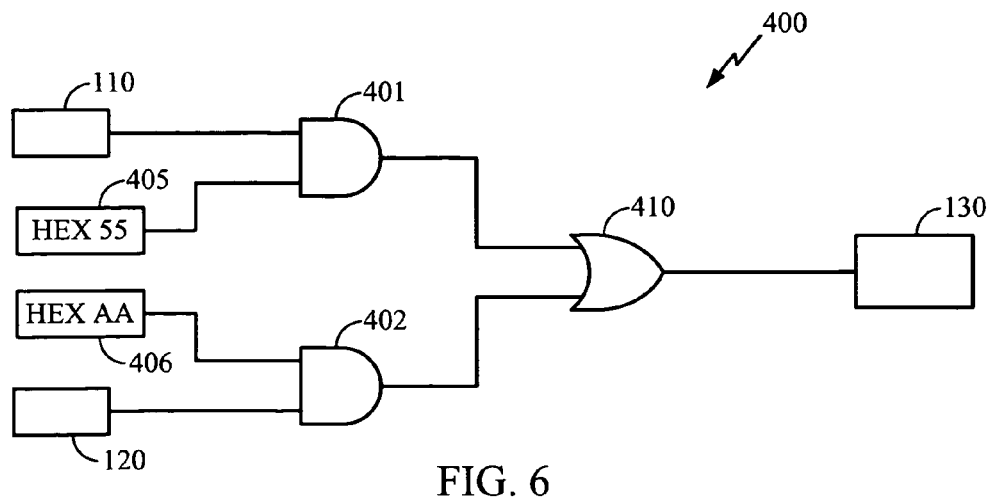
FIG. 6 is a logic diagram depicting a Viterbi pack instruction circuit.

FIG. 6 illustrates a non-limiting embodiment of a Viterbi pack circuit 400. The contents of first predicate register 110 are fed into AND gate 401 and ANDed with a hexadecimal 55, for example, which may be stored in memory 405. The contents of second predicate register 120 are fed into AND gate 402 and ANDed with a hexadecimal AA, for example, which may be stored in memory 406. For packing more than 2 registers, other appropriate hexadecimal values would be used. Memory 405 and memory 406 may be a single memory element or may be separate memory elements of any appropriate type. AND gates 401 and 402 are coupled to the input of OR gate 410. The output of OR gate 410 is fed to destination register 130.

Figure 7:
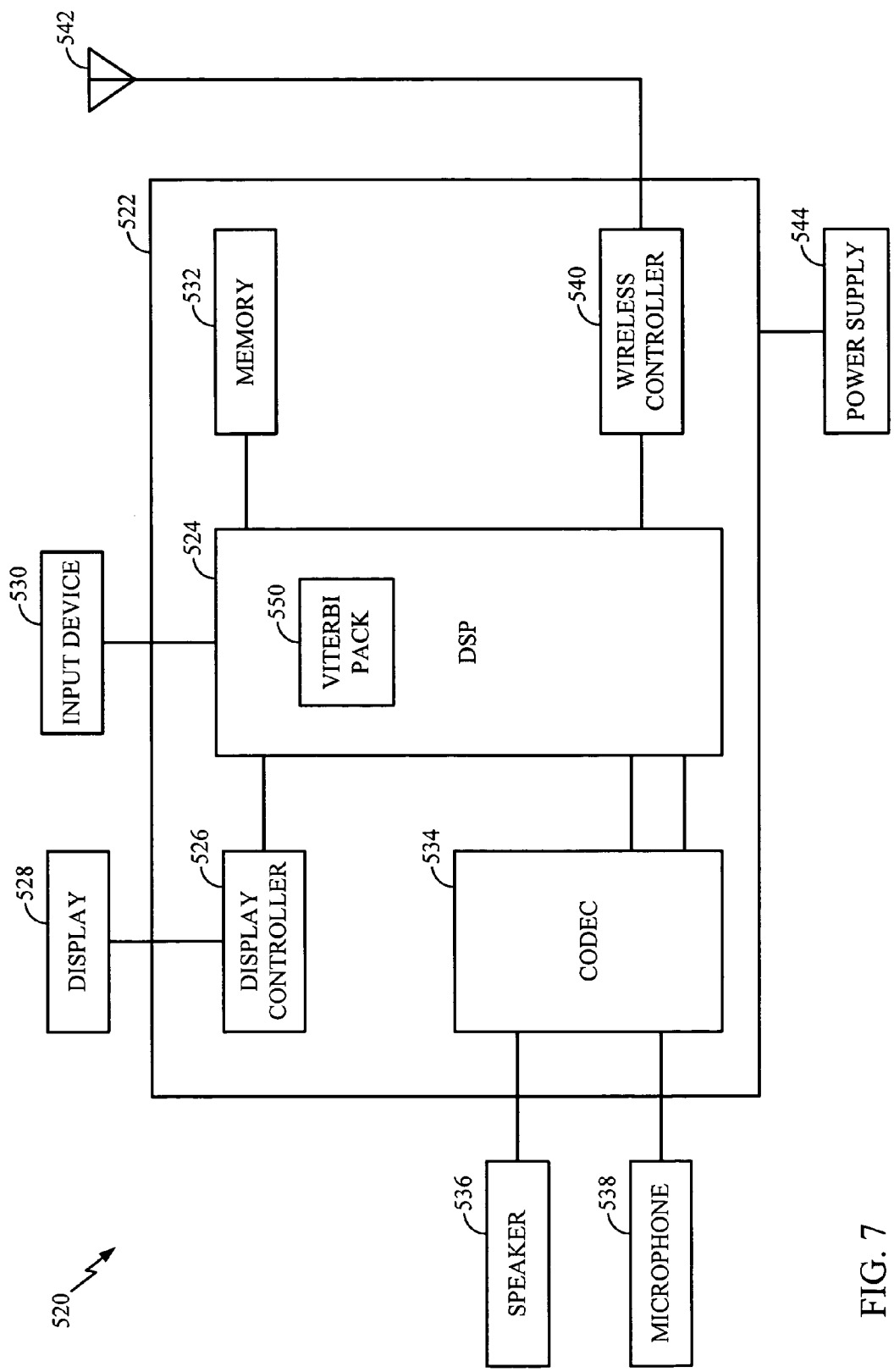
FIG. 7 is a diagram of a wireless communication device incorporating a Viterbi pack instruction of any of FIGS. 4-6.

FIG. 7 illustrates an exemplary, non-limiting embodiment of a wireless communication device that is generally designated 520. The wireless communication device includes a system 522 that includes a digital signal processor 524. Display controller 526 is coupled to the digital signal processor 524 and a display 528. Moreover, an input device 530 is coupled to the digital signal processor 524. As shown, a memory 532 is coupled to the digital signal processor 524. Additionally, a coder/decoder (CODEC) 534 can be coupled to the digital signal processor 524. A speaker 536 and a microphone 538 can be coupled to the CODEC 530. Digital signal processor 524 may include hardware or firmware and/or be capable of executing software that is capable of performing a Viterbi pack instruction 550, which may be of the type of any of the examples provided in FIGS. 4-6. If the Viterbi pack instruction 550 is in the form of software, the software may alternatively be stored in memory 532 and merely be executed in digital signal processor 524

FIG. 7 also indicates that a wireless controller 540 can be coupled to the digital signal processor 524 and a wireless antenna 542. In a particular embodiment, a power supply 544 is coupled to the system 522. The display 528, the input device 530, the speaker 536, the microphone 538, the wireless antenna 542, and the power supply 544 may be external to the system 522. However, each is coupled to a component of the system 522.

Those of skill would further appreciate that the various illustrative logical blocks, configurations, modules, circuits, and algorithm steps described in connection with the embodiments disclosed herein may be implemented as hardware, firmware, software, or any combination thereof. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in firmware, in a software module to be executed by a processor, or in any combination thereof. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. A Viterbi pack method comprising:
    masking contents of a first predicate register with a first masking value to produce first masked data and masking contents of a second predicate register with a second masking value to produce second masked data, wherein the first predicate register and the second predicate register comprise single-bit registers configured to control execution of predicated instructions; and
    writing the first masked data and the second masked data into a single destination register.

2. The Viterbi pack method of claim 1, wherein the first masked data comprises the even bits of the contents of the first predicate register and the odd bits of the contents of the second predicate register.

3. The Viterbi pack method of claim 1, further comprising ORing the first masked data and the second masked data together prior to the writing.

4. The Viterbi pack method of claim 1, wherein the masking the contents of a first predicate register comprises ANDing the contents of the first predicate register with the first masking value and wherein the masking the contents of the second predicate register comprises ANDing the contents of the second predicate register with the second masking value.

5. The Viterbi pack method of claim 4, wherein the first masking value comprises a hexadecimal 55 and the second masking value comprises a hexadecimal AA.

6. The Viterbi pack method of claim 1, wherein the method operates in a bitwise manner.

7. A device having a Viterbi pack circuit, the Viterbi pack circuit comprising:
    a first predicate register;
    a second predicate register, wherein the first predicate register and the second predicate register comprise single-bit registers configured to control execution of predicated instructions;
    a first destination register; at least one memory;
    a first AND gate having a first input coupled to the first predicate register, a second input coupled to the at least one memory, and an output;
    a second AND gate having a first input coupled to the second predicate register, a second input coupled to the at least one memory, and an output; and
    an OR gate having a first input coupled to the output of the first AND gate, a second input coupled to the output of the second AND gate, and an output coupled to the first destination register.

8. The device of claim 7, wherein the at least one memory stores a first masking value and a second masking value.

9. The device of claim 8, wherein the first masking value comprises a hexadecimal 55 and the second masking value comprises a hexadecimal AA.

10. The device of claim 7, further comprising a digital signal processor.

11. The device of claim 7, further comprising a wireless communications device.

12. A device configured to perform a Viterbi pack, comprising:
    means for masking contents of a first predicate register with a first masking value to produce first masked data and masking contents of a second predicate register with a second masking value to produce second masked data, wherein the first predicate register and the second predicate register comprise single-bit registers configured to control execution of predicated instructions; and
    means for writing the first masked data and the second masked data into a first destination register.

13. The device of claim 12, wherein the first masked data comprises the even bits of the contents of the first predicate register and the odd bits of the contents of the second predicate register.

14. The device of claim 12, further comprising means for ORing the first masked data and the second masked data together.

15. The device of claim 12, further comprising:
    means for ANDing the contents of the first predicate register with the first masking value; and
    means for ANDing the contents of the second predicate register with the second masking value.

16. The device of claim 15, wherein the first masking value comprises a hexadecimal 55 and the second masking value comprises a hexadecimal AA.

17. The device of claim 12, further comprising a digital signal processor.

18. The device of claim 12, further comprising a wireless communications device.

19. A program storage medium readable by a machine, tangibly embodying a program of instructions executable by the machine to perform steps of a Viterbi pack method, said method comprising:
    masking contents of a first predicate register with a first masking value to produce first masked data and masking contents of a second predicate register with a second masking value to produce second masked data, wherein the first predicate register and the second predicate register comprise single-bit registers configured to control execution of predicated instructions; and writing the first masked data and the second masked data into a single destination register.

20. The program storage medium of claim 19, wherein the first masked data comprises the even bits of the contents of the first predicate register and the odd bits of the contents of the second predicate register.

21. The program storage medium of claim 19, wherein the method further comprises ORing the first masked data and the second masked data together prior to the writing.

22. The program storage medium of claim 19, wherein the masking the contents of a first predicate register comprises ANDing the contents of the first predicate register with the first masking value and wherein the masking the contents of the second predicate register comprises ANDing the contents of the second predicate register with the second masking value.

23. The program storage medium of claim 22, wherein the first masking value comprises a hexadecimal 55 and the second masking value comprises a hexadecimal AA.

24. The program storage medium of claim 19, wherein the method operates in a bitwise manner.

25. A program storage medium readable by a machine, tangibly embodying a program of instructions executable by the machine to perform steps of a vector compare and pack method, said method comprising:

performing a first vector compare operation between a first vector stored in a first register and a second vector stored in a second register and storing the resulting vector in a first predicate register;

performing a second vector compare operation between a third vector stored in a third register and a fourth vector stored in a fourth register and storing the resulting vector in a second predicate register, wherein the first predicate register and the second predicate register comprise single-bit registers configured to control execution of predicated instructions;

masking contents of the first predicate register with a first masking value to produce first masked data and masking contents of the second predicate register with a second masking value to produce second masked data; and writing the first masked data and the second masked data into a single destination register.

26. The method of claim 25 wherein the first, second, third and fourth vectors are 64-bits wide and comprise four 16-bit half-words each;

the first and second predicate registers are each 8-bits wide, wherein a result of comparing two half-words comprises 2-bits; and the first masking value comprises a hexadecimal 55 and the second masking value comprises a hexadecimal AA.

* * * * *